(12) United States Patent
Kim et al.

(10) Patent No.: US 7,906,419 B2
(45) Date of Patent: Mar. 15, 2011

(54) LASER ANNEALING METHOD FOR MANUFACTURING SEMICONDUCTOR DEVICE

(75) Inventors: Jae Soo Kim, Seoul (KR); Cheol Hwan Park, Gyeonggi-do (KR); Ho Jin Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/275,332

(22) Filed: Nov. 21, 2008

(65) Prior Publication Data

US 2009/0246950 A1    Oct. 1, 2009

(30) Foreign Application Priority Data

Mar. 28, 2008    (KR) .................. 10-2008-0029148

(51) Int. Cl.
*H01L 21/3205*    (2006.01)
(52) U.S. Cl. .................. 438/595; 438/486; 438/648
(58) Field of Classification Search .................. 438/595, 438/486, 648
See application file for complete search history.

(56) References Cited

U.S. PATENT DOCUMENTS

| | | | | | |
|---|---|---|---|---|---|
| 5,405,804 | A | * | 4/1995 | Yabe | 438/662 |
| 5,569,151 | A | * | 10/1996 | Karwacki et al. | 588/249 |
| 6,522,679 | B1 | * | 2/2003 | Strowitzki et al. | 372/87 |
| 6,706,576 | B1 | * | 3/2004 | Ngo et al. | 438/197 |
| 6,900,121 | B1 | * | 5/2005 | Ngo et al. | 438/632 |
| 2009/0174041 | A1 | * | 7/2009 | Takeguchi | 257/659 |

FOREIGN PATENT DOCUMENTS

JP    06-120248 A    4/1994

OTHER PUBLICATIONS

Eric J. Lerner, Durable excimer lasers find new applications, Jul. 1998, Laser Focus World, vol. 34 issue 7, pp. 1-5.*
D. J. Wren, D. W. Setser, and J.K. Ku., XeF* and XeCl* Formation in Low-Pressure Tesla Coil Discharges, Aug. 6, 1981, American Chemical Society, pp. 284-291.*

* cited by examiner

*Primary Examiner* — Charles D Garber
*Assistant Examiner* — Stanetta D Isaac
(74) *Attorney, Agent, or Firm* — Ladas & Parry LLP

(57) ABSTRACT

A laser annealing method for manufacturing a semiconductor device is presented. The method includes at least two forming steps and one annealing step. The first forming steps includes forming gates on a semiconductor substrate. The second forming step includes forming an insulation layer on the semiconductor substrate and on the gates. The annealing step includes annealing the insulation layer using electromagnetic radiation emitted from a laser.

14 Claims, 7 Drawing Sheets

LASER ANNEALING METHOD FOR MANUFACTURING SEMICONDUCTOR DEVICE

CROSS-REFERENCE TO RELATED APPLICATIONS

The present application claims priority to Korean patent application number 10-2008-0029148 filed on Mar. 28, 2008, which is incorporated herein by reference in its entirety.

BACKGROUND OF THE INVENTION

The present invention relates to a method for manufacturing a semiconductor device, and more particularly, to a method for manufacturing a semiconductor device that uses excimer laser radiation to anneal borophosphosilicate glass (BPSG) to prevent or at least minimize boron from out-diffusing away from the BPSG layer to adjacent structures.

As is well known in the art, when manufacturing a semiconductor device, it is essential to form an insulation layer to fill the gaps between conductive patterns. As an example, in the conventional art, a BPSG layer is often used to fill in the gaps between gates.

A conventional method for manufacturing a semiconductor device, which adopts a BPSG layer as an interlayer dielectric, will be briefly described below.

After forming an isolation structure in a semiconductor substrate to delimit active regions, a plurality of gates are formed in the active regions of the semiconductor substrate. The gates have the stack structure comprising a gate insulation layer, a gate conductive layer and a gate hard mask layer.

Spacers are formed on both sidewalls of the gates, and junction areas are formed in the surface of the semiconductor substrate on both sides adjacent to the gates. A BGSG layer is formed as an interlayer dielectric on the resultant semiconductor substrate to cover the gates including the spacers and to cover the junction areas. The semiconductor substrate formed with the BPSG layer is then annealed. The annealing process is conducted in a furnace, for example, at a temperature of 820° C. for 4 hours.

By etching the BPSG layer having undergone the annealing process, contact holes for landing plugs are defined that simultaneously expose the plurality of gates and the junction areas between the gates. After forming a conductive layer for landing plugs to fill in the contact holes for landing plugs, by planarizing the conductive layer for landing plugs to expose the BPSG layer, landing plugs are formed.

However, in the conventional art as described above, the annealing process for the BPSG layer should be conducted for about 4 hours. While conducting this heating annealing process boron from the BPSG layer is likely to diffuse away from the BPSG and into adjacent outside structures. As a result, the boron that does diffuse away into adjacent outside structures, such as into the gates, the resulting electrical performance characteristics of transistors are likely to be degraded.

It is known that the diffusion of the boron can be prevented or at least minimized to some extent by forming a nitride layer for spacers on the semiconductor substrate including the gates before forming the BPSG interlayer. Nevertheless, even in this case of using nitride spacers, when annealing the insulation layer, some of the nitride spacers may be oxidated and/or lost. As a result of using nitride spacers boron can still infiltrate into the gates and therefore compromise the performance of the resulting transistor.

Further, increasing the thickness of the nitride spacers formed on both sidewalls of the gates to prevent the diffusion of the is boron has been proposed in the art. Unfortunately, since the gap between the gates gradually decreases as the high integration of semiconductor devices increases, then voids in the insulation layer are more likely to occur between the gates because to the spacers have increased in thickness. Therefore, it is substantially difficult to actually adopt this fabrication strategy of increasing the thickness of the spacers.

SUMMARY OF THE INVENTION

Embodiments of the present invention are directed to a method for manufacturing a semiconductor device that can prevent or at least minimize boron from diffusing away from a BPSG (borophosphosilicate glass) layer into adjacent structures.

In an aspect of the present invention, a method for manufacturing a semiconductor device comprises the steps of forming gates on a semiconductor substrate; forming an insulation layer on the semiconductor substrate and on the gates; and annealing the insulation layer using a laser.

After the step of forming the gates and before the step of forming the insulation layer, the method may further comprises the steps of forming spacers on both sidewalls of the gates; and forming a capping layer on the gates including the spacers and on the semiconductor substrate.

The spacers may be selected from the group consisting of an oxide layer and a nitride layer.

The capping layer may comprise a nitride layer.

The insulation layer comprises a BPSG layer.

Annealing is conducted using an excimer laser.

The annealing by the excimer laser is conducted using XeCl excimer laser.

The XeCl excimer laser uses Xe and HCl as a source gas and He. Ne and Ar as a diluent gas.

The annealing is conducted having an incident power density of 50~200 mJ/cm$^2$.

The annealing is conducted using wavelengths between about 248~308 nm.

The annealing is conducted using pulse widths of about 55~500 nsec.

The annealing is conducted using energy densities of about 120~790 ml/cm$^2$.

The annealing is conducted using about 1~1,000 laser pulses.

The annealing is conducted at temperatures of between about 800~1,100° C.

The annealing is conducted under a pressure of about $1\times10^{-6}$~1 Torr.

The step of forming the insulation layer and the step of annealing the insulation layer using the laser may be repeated twice.

DESCRIPTION OF SPECIFIC EMBODIMENTS

Hereafter, specific embodiments of the present invention will be described in detail with reference to the attached drawings.

FIGS. 1A through 1G are sectional views explaining the processes of a method for manufacturing a semiconductor device in accordance with one embodiment of the present invention.

Figure 1A:
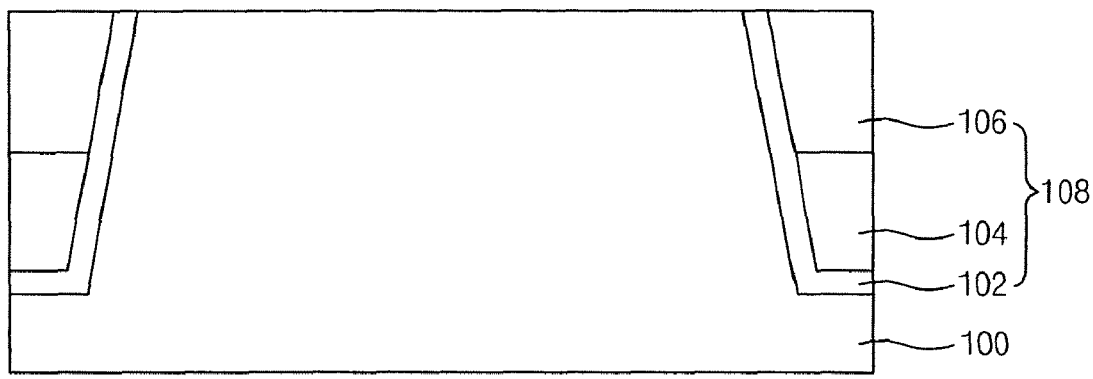
FIGS. 1A through 1G are sectional views explaining the processes of a method for manufacturing a semiconductor device in accordance with one embodiment of the present invention.

Referring to FIG. 1A, after defining trenches (not shown) by etching portions of a semiconductor substrate 100, a sidewall oxide (not shown) is formed on the surfaces of the trenches. A liner insulation layer 102 is formed on the semiconductor substrate 100 including the sidewall oxide. The liner insulation layer 102 is formed to include, for example, either a liner nitride layer and/or a liner oxide layer.

An SOD (spin-on dielectric) layer 104 is formed on the liner insulation layer 102. Afterwards an HDP (high density plasma) layer 106 is formed on the SOD layer 104 to completely fill the trenches. By CMPing (chemically and mechanically polishing) or etching back the HDP layer 106 and the liner insulation layer 102 until the semiconductor substrate 100 is exposed, an isolation structure 108 is formed to delimit the active regions of the semiconductor substrate 100.

Figure 1B:
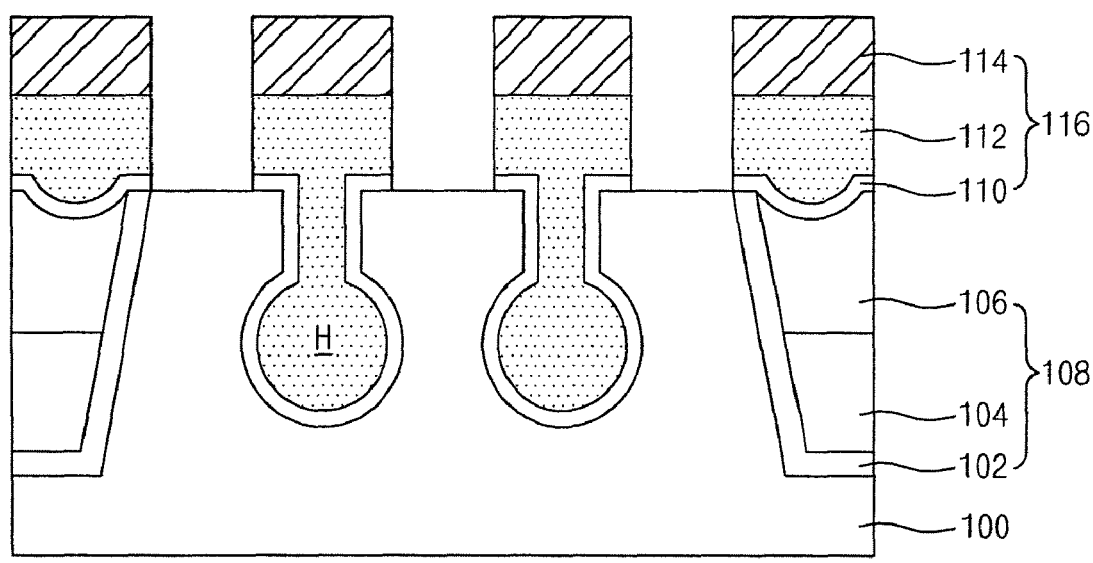

Referring to FIG. 1B, grooves H for gates are defined by etching the gate forming areas of the semiconductor substrate 100 which is formed with the isolation structure 108. Each of the grooves H for gates may be defined as a bulb type groove which is composed of a vertical groove and a spherical groove connected to the lower end of the vertical groove.

After forming a gate insulation layer 110 on the semiconductor substrate 100 including the surfaces of the grooves H for gates, a gate conductive layer 112 is then formed on the gate insulation layer 110 to fill the grooves H for gates. After forming a gate hard mask layer 114 on the gate conductive layer 112, the gate hard mask layer 114, the gate conductive layer 112 and the gate insulation layer 110 are then selectively etched to form a plurality of recess gates 116 in and over the grooves H for gates.

The gates 116 may be formed as planar gates or as fin type gates.

Figure 1C:
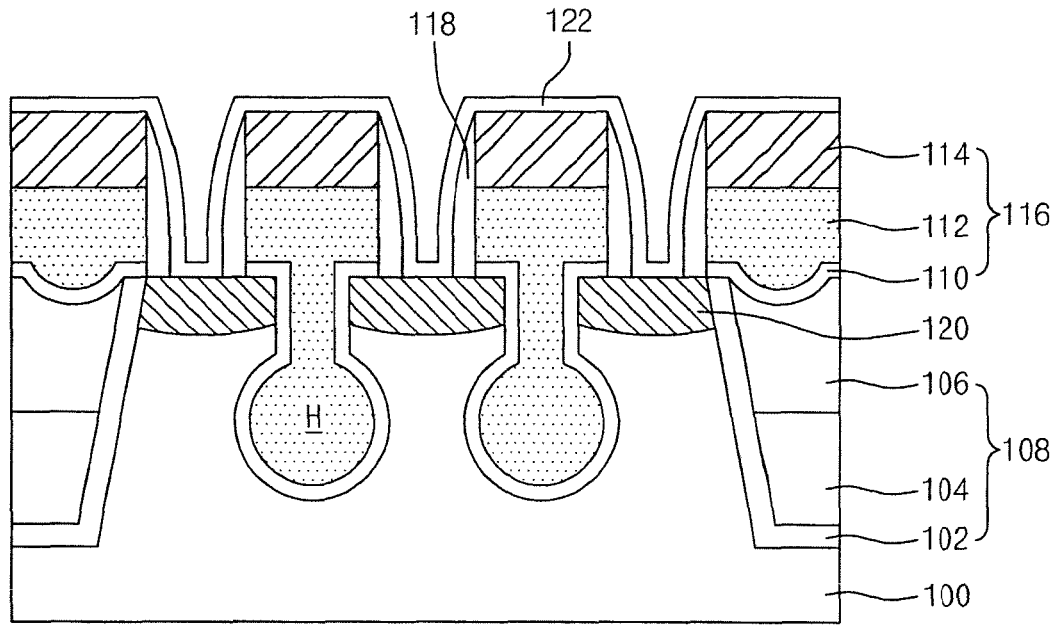

Referring to FIG. 1C, spacers 118 are formed on both sidewalls of the gates 116. The spacers 118 that are formed may comprise either an oxide layer, a nitride layer or admixtures thereof. By doping impurities in the surface of the semiconductor substrate 100 on both sides of the gates 116 including the spacers 118, junction areas 120 are then formed. A capping layer 122 comprising, for example, a nitride layer, is then formed on the entire surface of the resultant semiconductor substrate 100 which is formed with the junction areas 120.

Figure 1D:
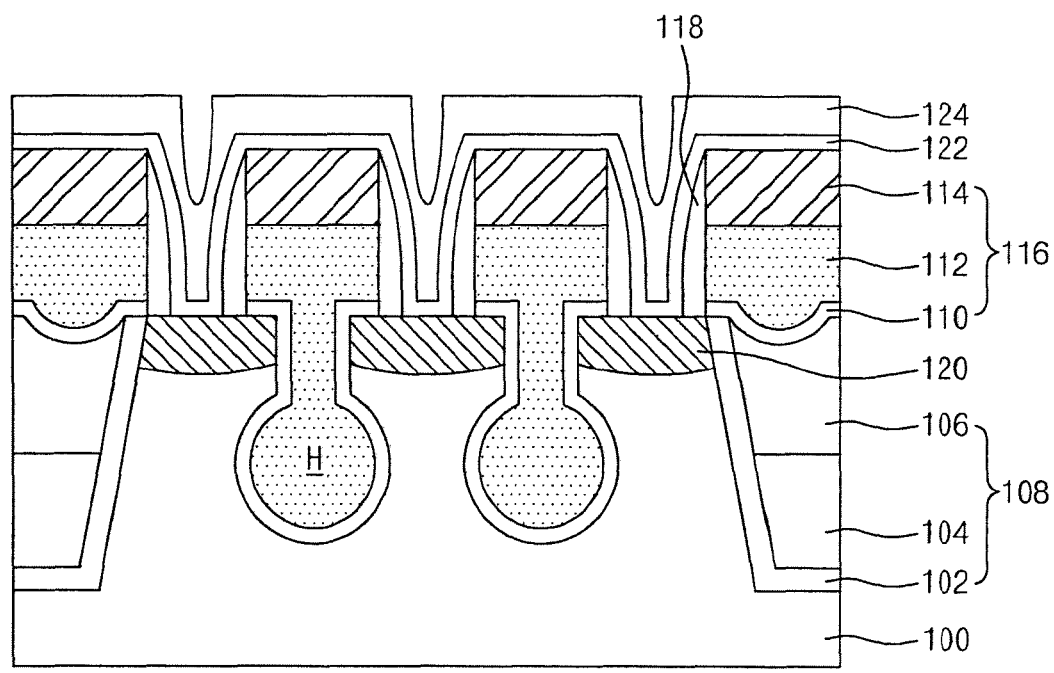

Referring to FIG. 1D, a first insulation layer 124 comprising a BPSG is then formed on the capping layer 122. The first insulation layer 124 may be formed to a thickness of 100~500 Å.

Figure 1E:
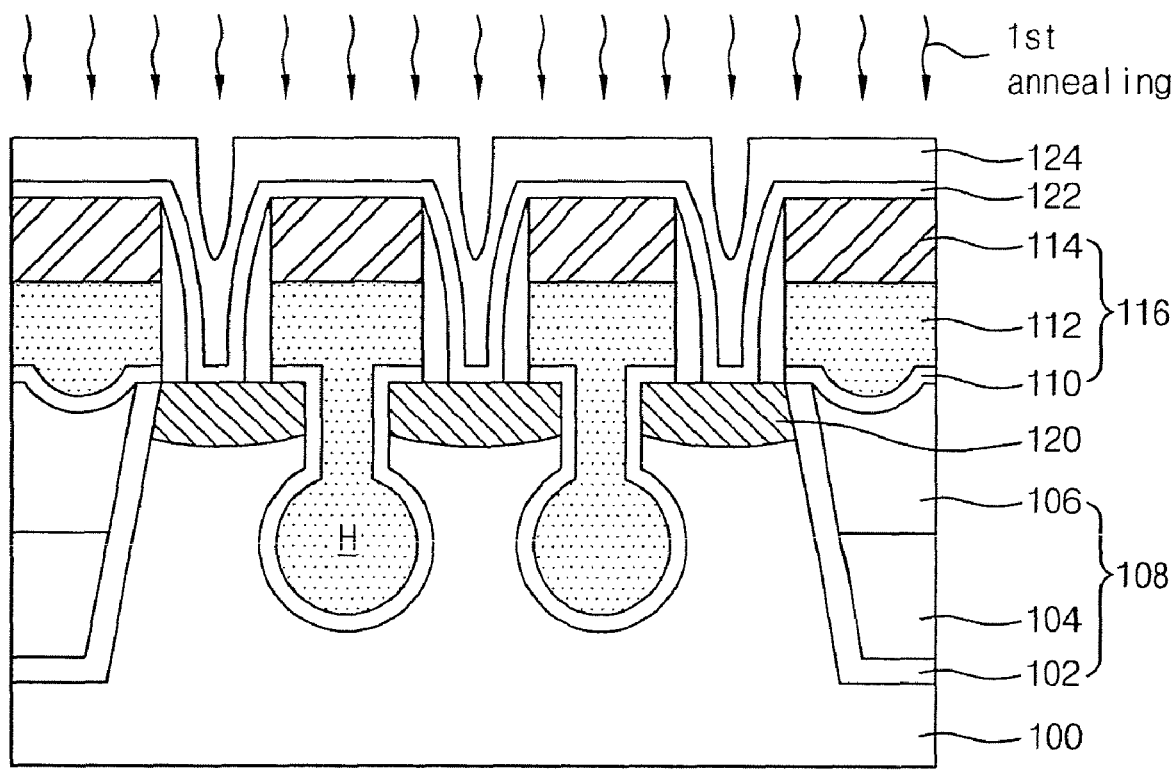

Referring to FIG. 1E, the first insulation layer 124 is primarily annealed using a laser. The primary annealing may be conducted using a XeCl excimer laser. The XeCl excimer laser may use Xe and HCl as a source gas and may use He, Ne and Ar as a diluent gas.

Also, the primary annealing may be conducted at a power density of 50~200 mJ/cm$^2$ in wavelengths of between 248~308 nm and pulse widths of 55~500 nsec. The primary annealing may be conducted having an incident energy density of about 120~790 mJ/cm$^2$ at a temperature of 800~1,100° C. under a pressure of $1\times10^{-6}$~1 Torr. Further, the primary annealing may be conducted using about 1~1,000 laser pulses.

Figure 1F:
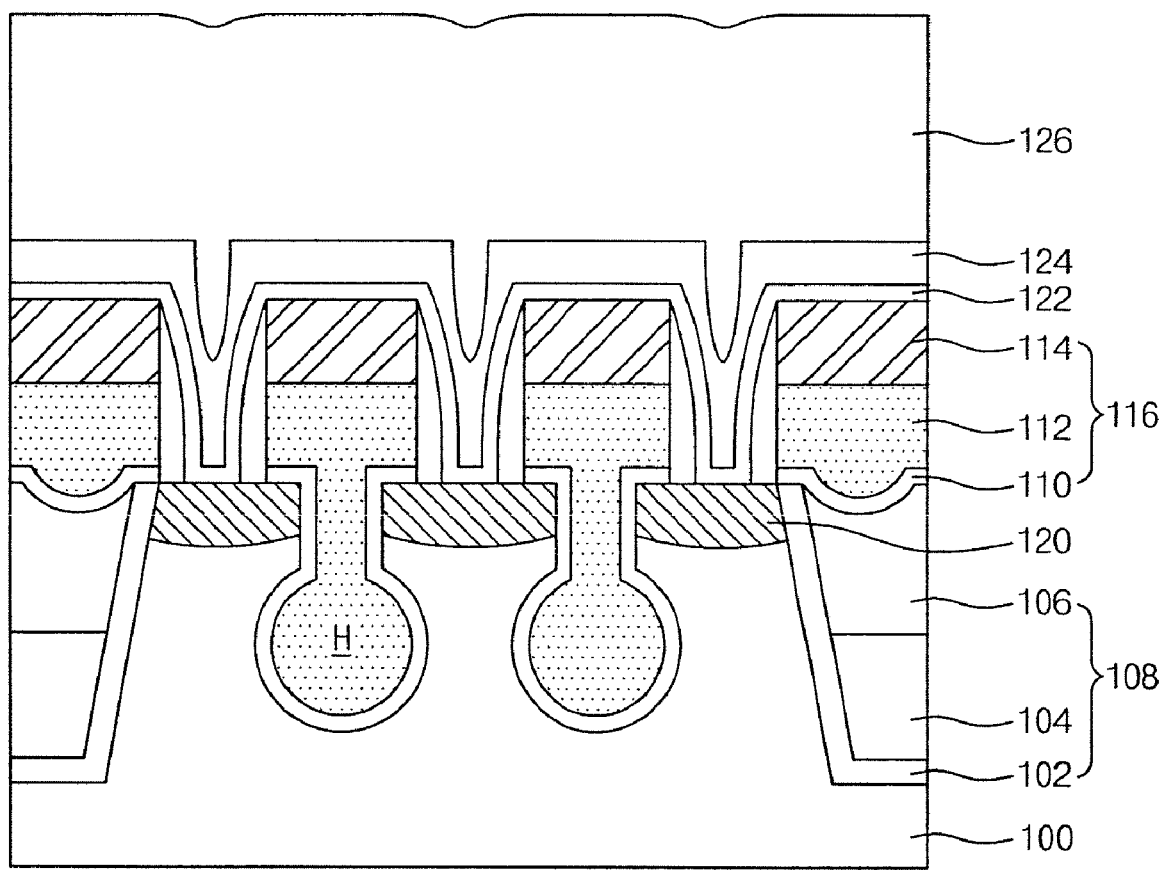

Referring to FIG. 1F, a second insulation layer 126 comprising a BPSG may be formed on the first insulation layer 124 after the first insulation layer 124 has undergone the primary annealing. The second insulation layer 126 may be formed to a thickness of 4,000~5,000 Å.

Figure 1G:
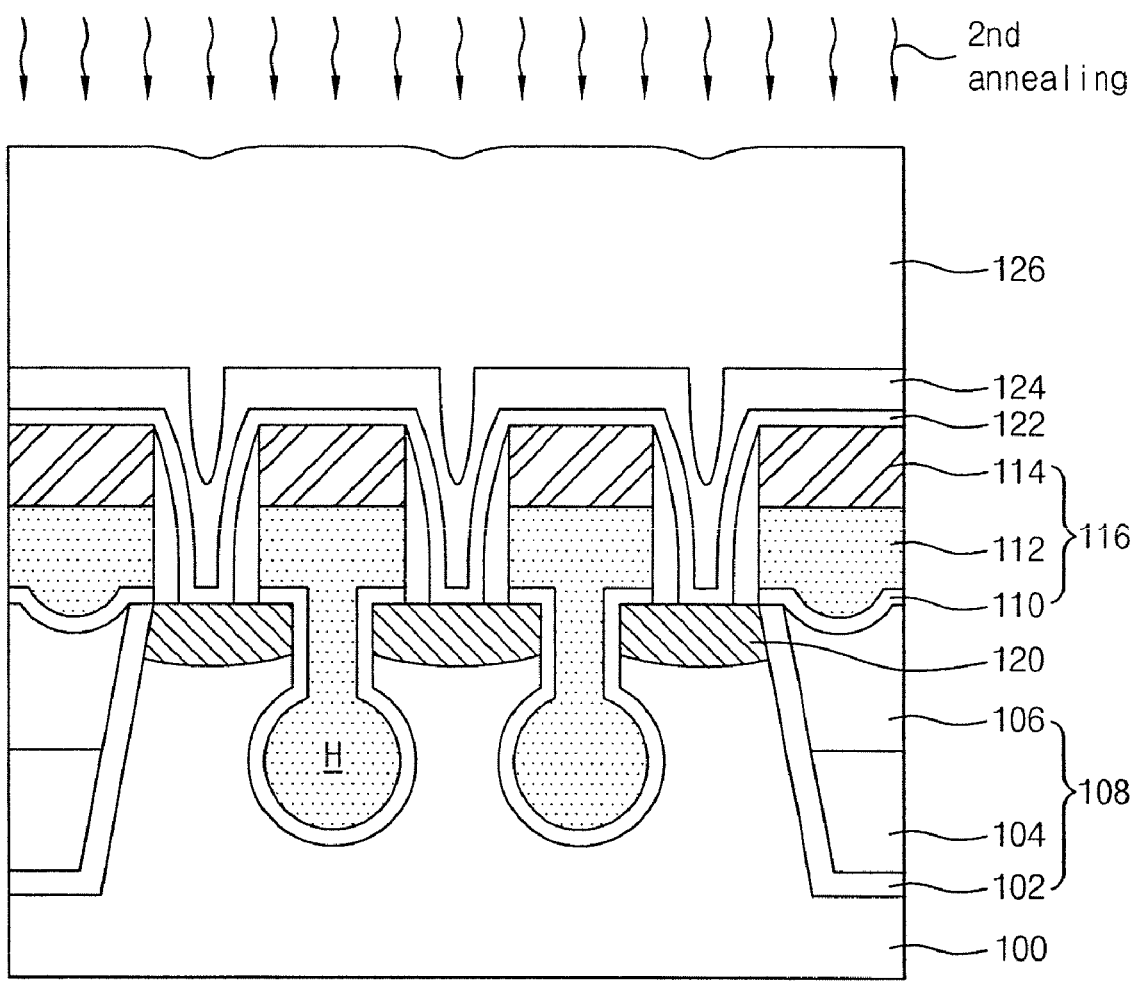

Referring to FIG. 1G, the second insulation layer 126 may also be secondarily annealed using a laser. The secondary annealing may also be conducted in substantially the same manner as performed in the primary annealing.

Thereafter, while not shown in the drawings, by sequentially conducting a series of well-known subsequent processes, the manufacture of a semiconductor device according to one embodiment of the present invention is completed.

In the aforementioned embodiment of the present invention, because the annealing step is conducted using a laser instead of being only heated in a furnace, the time needed to perform the annealing process can be substantially reduced. For example, conventional arts usually requires about 4 hours to anneal whereas the laser assisted annealing time can be reduced down to as low as 55~500 nsec in accordance to the present invention.

Through this, in the present invention, the damage to a semiconductor substrate due to annealing over a lengthy period can be minimized, and the outward diffusion of the boron contained in the BPSG layer can be minimized, whereby it is possible to prevent or at least substantially reduce the tendency of the electrical performance characteristics of transistors from degrading.

Also, in the present invention, since the outward diffusion of the boron from the BPSG layer is minimized, it is not necessary to increase the thicknesses of spacers and an insulation layer for spacers in order to prevent boron from diffusing into adjacent structures such as gates. Accoring, it is possible to prevent or at least minimize the occurrence of voids from being produced in an insulation layer between the gates.

Further, in the present invention, because it is not necessary to increase the thicknesses of spacers and an insulation layer for spacers, contact holes for landing plugs can more easily be aligned and SAC (self-aligned contact) failure can be prevented or at least minimized.

In addition, in the present invention, due to the fact that the BPSG layer may be formed and annealing twice, it is possible to effectively prevent voids from being produced in the BPSG layer.

Meanwhile, while it was described in the aforementioned embodiment that the outward diffusion of boron and the production of voids are prevented by forming the BPSG layer twice and conducting the annealing process two times, it is conceivable in another embodiment of the present invention that similar effects to the aforementioned embodiment can be obtained by forming a BPSG layer only once and conducting an annealing process only one time.

Figure 2A:
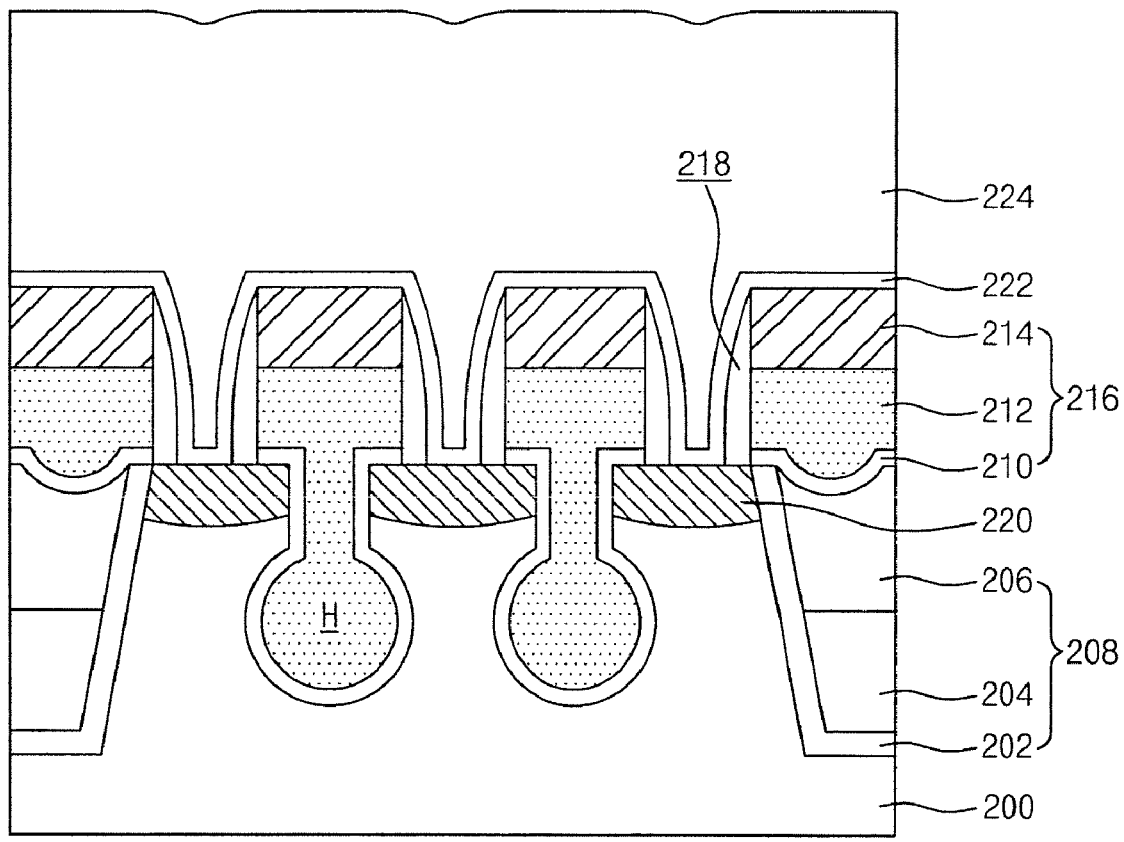
FIGS. 2A and 2B are sectional views explaining the processes of a method for manufacturing a semiconductor device in accordance with another embodiment of the present invention.
Figure 2B:
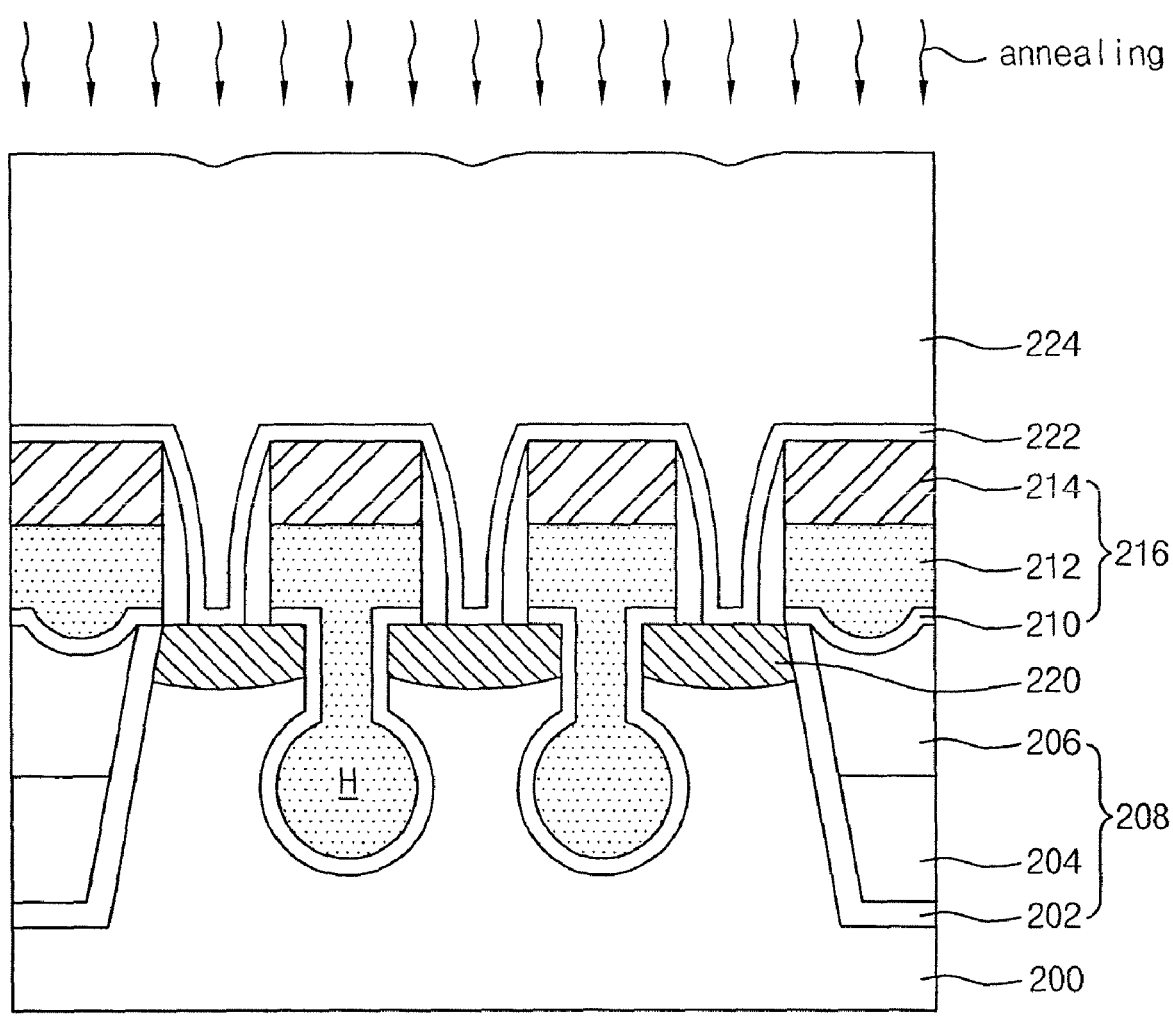

FIGS. 2A and 2B are sectional views explaining the processes of a method for manufacturing a semiconductor device in accordance with another embodiment of the present invention. The method will be described below.

Referring to FIG. 2A, after defining trenches by etching a semiconductor substrate 200, a liner insulation layer 202 is formed on the surfaces of the trenches. By forming sequentially an SOD layer 204 and an HDP layer 206 on the liner insulation layer 202, an isolation structure 208 is then formed in the semiconductor substrate 200 to delimit active regions.

A plurality of gates 216 are then formed in the active regions on the semiconductor substrate 200. The gates 216 are formed in and over grooves H for gates. The gates 216 may have the stack structure comprising a gate insulation layer 210, a gate conductive layer 212 and a gate hard mask layer 214. After forming spacers 218 on both sidewalls of the gates 216, junction areas 220 are then formed in the surface of the semiconductor substrate 200 on both sides of the gats 216 including the spacers 218.

A capping layer 222 comprising, for example, a nitride layer, is then formed on the entire surface of the semiconductor substrate 200 which is formed with the junction areas 220. An insulation layer 224 comprising a BPSG layer is then formed on the capping layer 222 to cover the gates 216. The insulation layer 224 may have a thickness of about 5,000~6,000 Å.

Referring to FIG. 2B, the insulation layer 224 is then annealed using electromagnetic irradiation using a laser. The annealing may be conducted using an excimer laser such as a XeCl excimer laser. The XeCl excimer laser may uses Xe and HCl as a source gas and may use He, Ne and Ar as a diluent gas.

Also, the annealing may be conducted at power density of about 50~200 mJ/cm$^2$, with a wavelength emission of about 248~308 nm and with a pulse width of about 55~500 nsec. The annealing may be conducted using an energy density of about 120~790 ml/cm$^2$ at a temperature of about 800~1,000° C. under a pressure of about $1 \times 10^{-6}$~1 Torr. Further, the annealing may be conducted using about 1~1,000 laser pulses.

Thereafter, while not shown in the drawings, by sequentially conducting a series of well-known subsequent processes, the manufacture of a semiconductor device according to another embodiment of the present invention is completed.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming gates on a semiconductor substrate;
    forming a first insulation layer on the semiconductor substrate and on the gates;
    primary annealing the first insulation layer using a laser;
    forming a second insulation layer on the first insulation layer having undergone the primary annealing; and
    secondary annealing the second insulation in the same manner as the primary annealing,
    wherein the primary and secondary annealing is conducted using a XeCl excimer laser using Xe and HCl as a source gas and using He, Ne and Ar as a diluent gas, and using a power density of 50~200 mJ/cm$^2$.

2. The method according to claim 1, wherein, after the step of forming the gates and before the step of forming the first insulation layer, the method further comprises the steps of:
    forming spacers on both sidewalls of the gates; and
    forming a capping layer on the gates, on the spacers and on the semiconductor substrate.

3. The method according to claim 2, wherein the spacers comprise at least one of an oxide layer and a nitride layer.

4. The method according to claim 2, wherein the capping layer comprises a nitride layer.

5. The method according to claim 1, wherein the first and second insulation layer comprises a borophosphosilicate glass (BPSG) layer.

6. The method according to claim 1, wherein the primary and secondary annealing is conducted using wavelengths between 248~308 nm.

7. The method according to claim 1, wherein the primary and secondary annealing is conducted using pulse widths of 55~500 nsec.

8. The method according to claim 1, wherein the primary and secondary annealing is conducted using energy densities of 120~790 mJ/cm$^2$.

9. The method according to claim 1, wherein the primary and secondary annealing is conducted using 1~1,000 laser pulses.

10. The method according to claim 1, wherein the primary and secondary annealing is conducted at a temperature of 800~1,100° C.

11. The method according to claim 1, wherein the primary and secondary annealing is conducted under a pressure of $1 \times 10^{-6}$~1 Torr.

12. The method according to claim 1, wherein the first insulation layer is formed to a thickness of about 100 to 500 Å.

13. The method according to claim 1, wherein the second insulation layer is formed to a thickness of about 4,000 to 5,000 Å.

14. The method according to claim 1, wherein the primary and secondary annealing are conducted about 55 to 500 nsec in total.

* * * * *